(12) United States Patent
Pavate et al.

(10) Patent No.: US 6,315,872 B1
(45) Date of Patent: Nov. 13, 2001

(54) COIL FOR SPUTTER DEPOSITION

(75) Inventors: Vikram Pavate; Murali Narasimhan, both of San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/415,328

(22) Filed: Oct. 8, 1999

Related U.S. Application Data

(63) Continuation-in-part of application No. 09/272,974, filed on Mar. 18, 1999, now Pat. No. 6,139,701, and a continuation-in-part of application No. 08/979,192, filed on Nov. 26, 1997, now Pat. No. 6,001,227.

(51) Int. Cl.[7] .................................................. C23C 14/34
(52) U.S. Cl. ............................ 204/192.15; 204/192.12; 204/192.17; 204/298.06
(58) Field of Search .................. 204/192.12, 192.15, 204/192.17, 298.06

(56) References Cited

U.S. PATENT DOCUMENTS

| | | | |
|---|---|---|---|
| 5,178,739 | * 1/1993 | Barnes et al. | 204/192.12 |
| 5,268,236 | 12/1993 | Dumont et al. | |
| 5,447,616 | 9/1995 | Satou et al. | |
| 5,456,815 | 10/1995 | Fukuyo et al. | |
| 5,809,393 | 9/1998 | Dunlop et al. | |

FOREIGN PATENT DOCUMENTS

| | | |
|---|---|---|
| 31 21 389A | 8/1992 | (DE) . |
| 196 09 439A | 9/1996 | (DE) . |
| 0 837 490 | * 4/1998 | (EP) . |
| 0 840 351 | * 5/1998 | (EP) . |
| 882813 | 12/1998 | (EP) . |
| 0 466 617 A | 1/1992 | (FR) . |
| 01132758 | 5/1989 | (JP) . |
| 03064447 | 3/1991 | (JP) . |
| 5214519 A | 8/1993 | (JP) . |
| 06017246 | 1/1994 | (JP) . |
| 06280005 | 10/1994 | (JP) . |
| 10-60633 | 3/1998 | (JP) . |
| 11-158614 | 12/1999 | (JP) . |

OTHER PUBLICATIONS

H. O. Shcrade et al., "Analysis of the Cathode Spot of Metal Vapor Arcs", IEEE Transactions on Plasma Science, vol. PS–11, No. 3, pp. 103–110 (1983).
Murr et al., "Microstructural aspects of hypervolicity impact cratering and jetting in copper," Journal of Material Science, 31 pp. 5915–5932 (Nov. 1996).
Derwent Abstract No. 1999–435724 (Jul. 1999).
A.S. Pokrovskaya et al.: "Electrical Strength of Vacuum Gap With Electrodes Made of Carbographite Materials", Proceedings of the Sixth International Symposium on Discharges and Electrical Insulation in Vacuum, Swansea, UK,Jul. 1974, pp. 86–91.
G.T.Murray, Preparation and Characterization of Pure Metals, Cubberley et al: "Metals Handbook, 9th Edition, vol. 2,Properties and Selection: Nonferrous Alloys and Pure Metals." Apr. 17, 1983, American Society for Metals, Oh, US. XP002094554 86, pp. 709–713.
PCT Notification of Transmittal of the International Search Report from the International Searching Authority at the European Patent Office dated 165/03/1999, 76 pages (for parent application No. 08/979,192, filed Nov. 26, 1997).

* cited by examiner

*Primary Examiner*—Rodney G. McDonald
(74) *Attorney, Agent, or Firm*—Dugan & Dugan

(57) ABSTRACT

Coils for use within high density plasma chambers are provided that do not electrically disconnect or short circuit following repeated depositions and that produce films having reduced in-film defect densities. To reduce in-film defect densities, dielectric inclusion content, porosity, grain size and surface roughness of a coil are reduced, while the mechanical strength of the coil is increased so as to both decrease defect generation and thermal creep rate (e.g., to prevent electrical disconnection or short circuiting of the coil following repeated depositions).

9 Claims, 4 Drawing Sheets

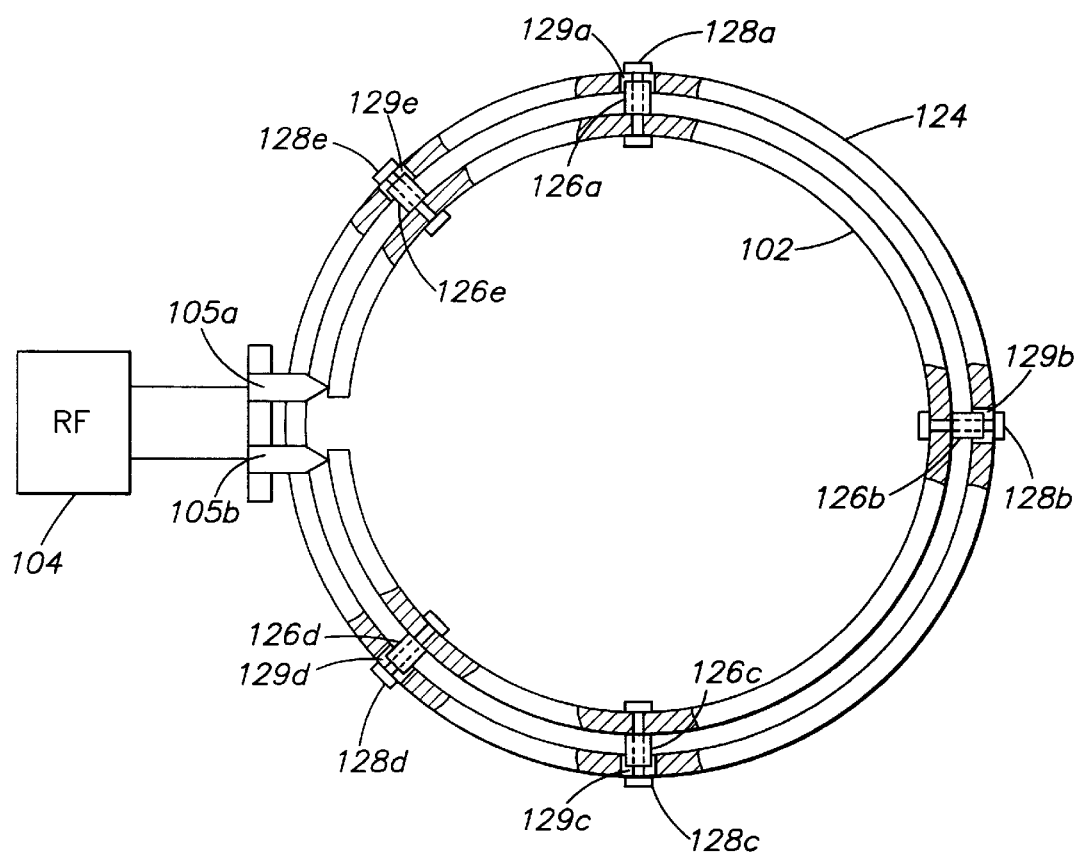
FIG. 1B
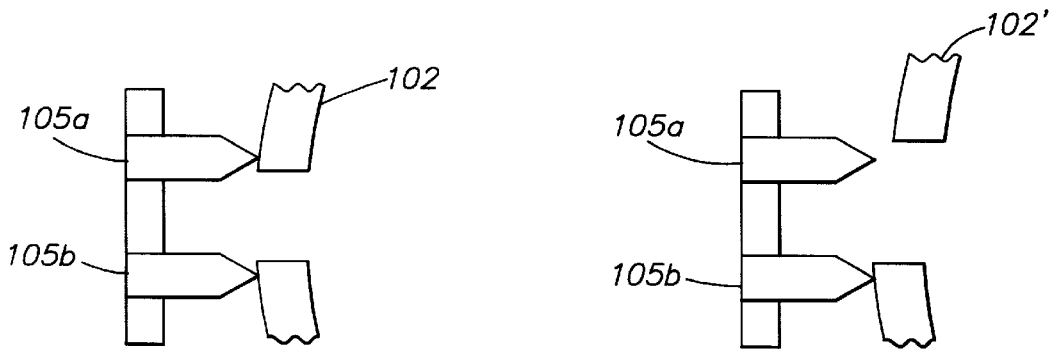
FIG. 1C
FIG. 1D
(PRIOR ART)

COIL FOR SPUTTER DEPOSITION

This application is a continuation-in-part of U.S. patent application Ser. No. 08/979,192, filed Nov. 26, 1997, now U.S. Pat. No. 6,001,227 titled "IMPROVED TARGET FOR USE IN MAGNETRON SPUTTERING OF ALUMINUM FOR FORMING METALLIZATION FILMS HAVING LOW DEFECT DENSITIES AND METHODS FOR MANUFACTURING AND USING SUCH TARGET" and of U.S. patent application Ser. No. 09/272,974, filed Mar. 18, 1999, now U.S. Pat. No. 6,139,701 titled "IMPROVED COPPER TARGET FOR SPUTTER DEPOSITION".

FIELD OF THE INVENTION

The present invention relates generally to metal film deposition and more particularly to an improved coil for reducing defect generation during metal film deposition within a high density plasma deposition chamber.

BACKGROUND OF THE INVENTION

Metal films are used widely within semiconductor integrated circuits to make contact to and between semiconductor devices (i.e., metal interconnects). Because of the high densities required for modern integrated circuits, the lateral dimensions of interconnects, as well as the lateral dimensions between interconnects, have shrunk to such a level that a single defect can destroy an entire wafer die by shorting a junction region or open-circuiting a gate electrode of an essential semiconductor device. Defect reduction within interconnect metal films, therefore, is an ever-present goal of the semiconductor industry that increases in importance with each generation of higher density integrated circuits.

Interconnect metal films typically are deposited via physical vapor deposition and more recently via high density plasma (HDP) deposition, within a plasma chamber. In both processes, a target of to-be-deposited material (e.g., the metal comprising the interconnect) is sputtered through energetic ion bombardment that dislodges atoms from the target. The dislodged atoms travel to a substrate disposed below the target and form a metal film thereon. The metal film is patterned to form the interconnect.

For HDP deposition, in addition to the target, a coil is provided between the target and the substrate. The coil's primary role is to increase the plasma density, i.e., ionization fraction, and thereby create conditions to ionize target atoms sputtered from the target. Ionized target particles will, under the influence of an electric field applied between the target and the substrate, strike the substrate substantially perpendicular to the target face and substantially perpendicular to any feature base present on the substrate (e.g., allowing for improved filling of vias and other surface features). Where the coil is located internally of the chamber, the coil itself is sputtered, and dislodged coil atoms travel to the substrate disposed below the coil and deposit thereon. Sputtered coil atoms predominantly coat the substrate near its edges and, where the target atoms create a center thick film on the wafer, enhance the overall thickness uniformity of the material layer formed on the substrate. The material properties of an HDP coil therefore play an important role in overall deposited film quality.

As described in parent applications, U.S. Ser. No. 08/979, 192, filed Nov. 26, 1997 and U.S. Ser. No. 09/272,974, filed Mar. 18, 1999, both aluminum target manufacturers and copper target manufacturers conventionally focus on the purity of sputtering targets to reduce defect densities or to otherwise affect deposition of high quality metal films. Similar emphasis is placed on the purity of coils employed in HDP deposition chambers (e.g., HDP deposition chambers typically employ a target and a coil having similar purity levels). However, despite high purity levels for both targets and coils, the defect densities of conventional HDP deposited metal films remain high.

Accordingly, a need exists for a coil for use within an HDP deposition chamber that produces metal films having reduced defect densities.

SUMMARY OF THE INVENTION

The present inventors have discovered that in addition to target purity, other factors are of significant importance to defect reduction as recognized and described in parent applications, U.S. Ser. No. 08/979,192, filed Nov. 26, 1997 and U.S. Ser. No. 09/272,974, filed Mar. 18, 1999. These other factors must be considered to reduce defect densities during plasma deposition as the purity of the target alone does not assure adequate metal film quality and high device yield.

Specifically, it has been found that in addition to target material purity, the following target material parameters have a direct affect on defect generation during sputter deposition of metal films: dielectric inclusion content (e.g., target material oxides, nitrides, etc.), porosity (e.g., non-conductive voids due to gas trapping during target formation), grain size, surface roughness and hardness. With respect to aluminum targets, control of dielectric inclusions is of primary importance for controlling aluminum film quality. Reducing the concentration of dielectric inclusions such as $Al_2O_3$ within an aluminum target can decrease certain as-deposited or "in-film" defect densities (e.g., splat densities) by up to five fold. With respect to copper targets, increasing the hardness of a copper target is as much a factor in defect reduction as reduced dielectric inclusion concentration. Namely, a certain hardness range for the copper target is required to provide the copper target with sufficient mechanical/electrical strength to prevent localized mechanical breakdown, and thus ejection of a relatively large, greater than a few microns piece of target material, during plasma processing.

For HDP deposition processes, the present inventors have discovered that defect reduction results when a coil (e.g., aluminum or copper) has material parameters similar to the above described target material parameters (e.g., reduced dielectric inclusion concentration, sufficient hardness, etc.). Also, it has been found that thermal cycling can cause the coil to move sufficiently to disconnect it from the terminal or feedthrough through which it connects to its power supply or to short circuit the coil through contact with another chamber structure such as a shield that supports the coil. Thus, to prevent a coil from electrically disconnecting or short circuiting following repeated depositions (e.g., due to repeated expansion and contraction caused by thermal cycling), the thermal creep rate and mechanical strength of the coil must be considered. As used herein, thermal creep rate refers to the time rate at which a material changes shape due to prolonged stress or exposure to elevated temperatures.

To control the thermal creep rate and strength of a copper coil, the coil's grain size preferably is reduced. For example, a copper coil's grain size preferably is limited to below 50 microns, and most preferably to below 25 microns. The smaller the grain size, the lower the thermal creep rate and the greater the strength of the copper coil. The preferred thermal creep rate, strength and grain size are achieved by limiting the copper coil's purity level to a level of less than 99.9999%, preferably within the range from 99.995% to 99.9999% (e.g., less pure than previously believed necessary). This overall purity level range is maintained while the concentration levels of impurities that adversely affect a copper coil's thermal creep rate and strength are reduced (e.g., antimony, arsenic, bismuth, hydrogen, oxygen, sulfur, etc.). An aluminum coil's thermal creep rate and strength primarily are controlled by alloying (as is known in the art).

By thus controlling the dielectric inclusion content, porosity, grain size, surface roughness, thermal creep rate and strength of a coil, defect generation during HDP deposition may be decreased while the risk of the coil becoming electrically disconnected or short circuited during processing is reduced.

Other objects, features and advantages of the present invention, as well as the structure of various embodiments of the invention, will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numerals indicate identical or functionally similar elements. Additionally, the leftmost digit of a reference numeral identifies the drawing in which the reference numeral first appears.

FIG. 1B is a top plan view of the coil and shield of FIG. 1A;

FIG. 1C is a close-up view of the feedthroughs and coil of FIG. 1B;

FIG. 1D is a close-up view of the feedthroughs of FIG. 1B electrically disconnected from a conventional coil;

DETAILED DESCRIPTION OF THE PREFERRED EMBODIMENTS

Figure 1A:
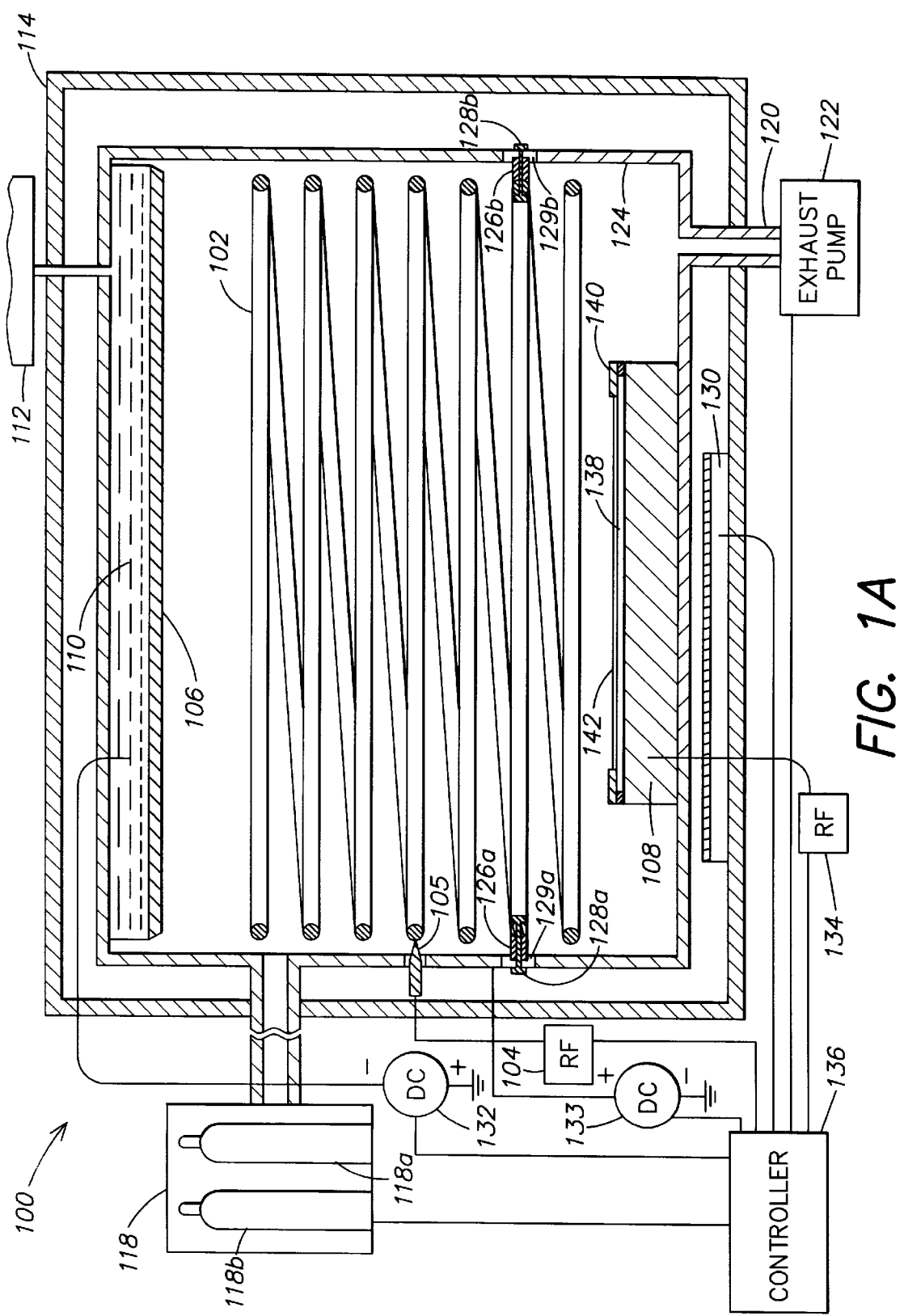
FIG. 1A is a side diagrammatic illustration, in section, of the pertinent portions of a high density plasma sputtering chamber configured in accordance with the present invention.

FIG. 1A is a side diagrammatic illustration, in section, of the pertinent portions of a conventional high density plasma (HDP) sputtering chamber 100 configured in accordance with the present invention. The sputtering chamber 100 contains a coil 102 which is operatively coupled to a first RF power supply 104 via one or more feedthroughs 105. The coil 102 may comprise a plurality of coils, a single turn coil as shown in FIG. 1A, a single turn material strip, or any other similar configuration. The coil 102 is positioned along the inner surface of the sputtering chamber 100, between a sputtering target 106 and a substrate pedestal 108. Both the coil 102 and the target 106 are formed from the to-be-deposited material (e.g., copper, aluminum, etc.).

The substrate pedestal 108 is positioned in the lower portion of the sputtering chamber 100 and typically comprises a pedestal heater (not shown) for elevating the temperature of a semiconductor wafer or other substrate supported by the substrate pedestal 108 during processing within the sputtering chamber 100. The sputtering target 106 is mounted to a water cooled adapter 110 in the upper portion of the sputtering chamber 100 so as to face the substrate receiving surface of the substrate pedestal 108. A cooling system 112 is coupled to the adapter 110 and delivers cooling fluid (e.g., water) thereto.

The sputtering chamber 100 generally includes a vacuum chamber enclosure wall 114 having at least one gas inlet 116 coupled to a gas source 118 and having an exhaust outlet 120 coupled to an exhaust pump 122 (e.g., a cryopump or a cryoturbo pump). The gas source 118 typically comprises a plurality of processing gas sources 118a, 118b such as a source of argon, helium and/or nitrogen. Other processing gases may be employed if desired.

A removable shield 124 that surrounds the coil 102, the target 106 and the substrate pedestal 108 is provided within the sputtering chamber 100. The shield 124 may be removed for cleaning during chamber maintenance, and the adapter 110 is coupled to the shield 124 (as shown). The shield 124 also supports the coil 102 via a plurality of cups 126a–e attached to, but electrically isolated from the shield 124, and via a plurality of pins 128a–e coupled to both the cups 126a–e and the coil 102. The coil 102 is supported by resting the coil 102 on the pins 128a–e which are coupled to the cups 126a–e. Any other known methods for supporting the coil 102 may be similarly employed. The cups 126a–e and the pins 128a–e comprise the same material as the coil 102 and the target 106 (e.g., copper or aluminum) and are electrically insulated from the shield 124 via a plurality of insulating regions 129a–e (e.g., a plurality of ceramic regions). The structure of the cups 126a–e, the pins 128a–e and the insulating regions 129a–e are described further below with reference to FIGS. 1B–1F. The sputtering chamber 100 also includes a plurality of bake-out lamps 130 located between the shield 124 and the chamber enclosure wall 114, for baking-out the sputtering chamber 100 as is known in the art.

The sputtering target 106 and the substrate pedestal 108 are electrically isolated from the shield 124. The shield 124 may be grounded so that a negative voltage (with respect to grounded shield 124) may be applied to the sputtering target 106 via a first DC power supply 132 coupled between the target 106 and ground, or may be floated or biased via a second DC power supply 133 coupled to the shield 124. Additionally, a negative bias may be applied to the substrate pedestal 108 via a second RF power supply 134 coupled between the pedestal 108 and ground. A controller 136 is operatively coupled to the first RF power supply 104, the first DC power supply 132, the second DC power supply 133, the second RF power supply 134, the gas source 118 and the exhaust pump 122.

To perform deposition within the sputtering chamber 100, a substrate 138 (e.g., a semiconductor wafer, a flat panel display, etc.) is loaded into the sputtering chamber 100, is placed on the substrate pedestal 108 and is securely held thereto via a clamp ring 140. An inert gas such as argon then is flowed from the gas source 118 into the high density plasma sputtering chamber 100 and the first DC power supply 132 biases the sputtering target 106 negatively with respect to the substrate pedestal 108 and the shield 124. In response to the negative bias, argon gas atoms ionize and form a plasma within the high density plasma sputtering chamber 100. An RF bias preferably is applied to the coil 102 via the first RF power supply 104 to increase the density of ionized argon gas atoms within the plasma and to ionize target atoms sputtered from the target 106 (as described below).

Because argon ions have a positive charge, argon ions within the plasma are attracted to the negatively biased sputtering target 106 and strike the sputtering target 106 with sufficient energy to sputter target atoms from the target 106. The RF power applied to the coil 102 increases the ionization of the argon atoms, and, in combination with the coupling of the coil power to the region of argon and sputtered target atoms, results in ionization of at least a substantial portion of the sputtered target atoms. The ionized, sputtered target atoms travel to and deposit on the substrate 138 so as to form over time a continuous target material film 142 thereon. Because the sputtered target atoms are ionized by the coil 102, the target atoms strike the substrate 138 with increased directionality under the influence of the electric field applied between the target 106 and the substrate pedestal 108 (e.g., by the first DC power supply 132). The second RF power supply 134 may be employed to apply a negative bias to the substrate pedestal 108 relative to both the sputtering target 106 and to shield 124 to further attract sputtered target atoms to the substrate 138 during deposition.

In addition to target atoms, coil atoms are sputtered from the coil 102 during deposition and deposit on the substrate 138. Because of the coil's proximity to the wafer's edge the sputtered coil atoms predominantly coat the substrate 138 near its edges and, where the flat target atoms tend to deposit a center thick layer, result in overall uniformity of the thickness of the film 142 deposited on the substrate 138. Following deposition, the flow of gas to the high density plasma sputtering chamber 100 is halted, all biases (e.g., target, pedestal and coil) are terminated, and the substrate 138 is removed from the high density plasma sputtering chamber 100.

Ideally, the film 142 deposited on the substrate 138 is highly uniform and defect free. However, as described in parent applications U.S. Ser. No. 08/979,192, filed Nov. 26, 1997 and U.S. Ser. No. 09/272,974, filed Mar. 18, 1999, a substantial number of blobs or splats of target material (i.e., splat defects or splats) appear within films formed by sputter deposition when a conventional sputtering target is employed. High density plasma deposited films exhibit similar splat defects when conventional coils and/or conventional sputtering targets are employed.

Splat defects are believed to result from arc-induced localized heating of a target or a coil that melts and liberates a portion of the target/coil material. The liberated target/coil material travels to the substrate 138, splatters thereon, cools and reforms, due to surface tension, as a splat defect in the deposited film 142. Splats are very large (e.g., 500 $\mu$m) in relation to typical metal line widths (e.g., less than 1 $\mu$m) and affect device yield by shorting over two or more metal lines. It is believed that up to 50% of the in-film defects produced in current interconnect metallization schemes are induced, splat-type defects.

The present inventors have discovered that the following target/coil material parameters have a direct affect on splat generation:

1. the number of dielectric inclusions such as target/coil material oxides (e.g., $Al_2O_3$ for aluminum targets and coils, CuO for copper targets and coils, etc.);
2. the porosity of the target/coil material (e.g., the number of non-conductive voids due to gas trapping during target or coil formation);
3. the grain size of the target/coil material;
4. the surface roughness of the target /coil; and
5. the mechanical strength or hardness of the target/coil.

As described in parent application, U.S. Ser. No. 08/979,192, filed Nov. 26, 1997, with regard to aluminum targets, control of the number of dielectric inclusions is of primary importance for reducing splat formation (e.g., all other causes create a minimal number of splats as compared to those caused by dielectric inclusions). During HDP deposition of aluminum, control of the number of dielectric inclusions within an aluminum coil is of primary importance for reducing splat formation due to the coil. Other aluminum target and aluminum coil manufacturing parameters may be controlled less stringently without undue risk of significantly increased splat formation.

As described in parent application, U.S. Ser. No. 09/272,974, filed Mar. 18, 1999, in contrast to the mechanical properties of aluminum targets, the mechanical properties (e.g., mechanical strength/hardness, grain size, and surface roughness) of copper targets play a very significant role (in addition to dielectric inclusions) in splat formation. Mechanical properties have been found to play a similar role in splat formation with regard to copper coils used during HDP deposition of copper.

Accordingly, to reduce arc-induced splat formation during plasma processing within an HDP deposition chamber, any target (e.g., aluminum, copper, etc.) and any coil employed preferably have the following properties: a reduced number of dielectric inclusions, non-porosity (e.g., few voids and little entrapped gas), and good mechanical properties (e.g., high strength or hardness, small grain size and little surface roughness). The significance each factor plays in splat formation, however, depends on the target/coil material in question.

For instance, aluminum target/coil material typically comprises an aluminum alloy such as AlCu (typically less than 0.5% Cu) that when manufactured with prior art methodologies, has sufficient mechanical strength and small enough grain size to prevent significant splat formation due to arc-induced mechanical failure and surface-roughness-induced field-enhanced emission. However, aluminum's primary dielectric inclusion ($Al_2O_3$) is highly resistive and charges easily when exposed to a plasma environment. Therefore, splat formation due to dielectric breakdown and secondary electron heating is common in aluminum targets/coils. Accordingly, decreasing dielectric inclusion content (rather than improving mechanical properties) within an aluminum target/coil is the primary mechanism for reducing splat formation during aluminum film formation.

With respect to reducing splat formation during copper film deposition, improving the mechanical properties of a copper target/coil is as important as decreasing dielectric inclusion content. Because copper target/coil material is highly pure copper and not an alloy (i.e., it is not purposefully alloyed with a second material), the hardness of the copper target/coil material is dictated by the intrinsic hardness of copper and any impurities within the copper.

Copper is naturally a soft metal, and copper target/coil material becomes softer as the purity level of the material increases. Additionally, the grain size of the copper target/coil material increases with increasing purity. Accordingly, the present inventors have discovered that above a certain purity level, splat formation during copper film deposition actually increases (due to arc-induced mechanical failure and surface-roughness-induced field-enhanced emission) with increasing levels of copper target/coil material purity.

Further, the main dielectric inclusion within copper (e.g., CuO), is not as highly resistive as $Al_2O_3$. CuO, therefore, is less susceptible to charging at the inclusion to metal interface region, dielectric breakdown and secondary electron heating than is $Al_2O_3$, and splat formation due to dielectric inclusions is less pronounced for copper targets/coils. Nonetheless, splat formation can occur during use of copper targets/coils due to CuO induced charging at a CuO inclusion to metal interface region, dielectric breakdown and secondary electron heating and control of dielectric inclusion content within copper target/coil material remains important to reduce these effects.

With regard to the coil 102, in addition to the above described properties (e.g., reduced dielectric inclusion content, porosity, material grain size, surface roughness, etc.), thermal creep rate of the coil 102 also must be considered. Specifically, the coil 102 should be provided with sufficient mechanical strength to reduce the thermal creep rate of the coil 102 to a value that prevents electrical disconnection of the coil 102 from the feedthroughs 105 or electrical shorting of the coil 102 due to contact with the shield 124 following repeated depositions within the chamber 100 as described with reference to FIGS. 1B–1F.

Figure 1E:
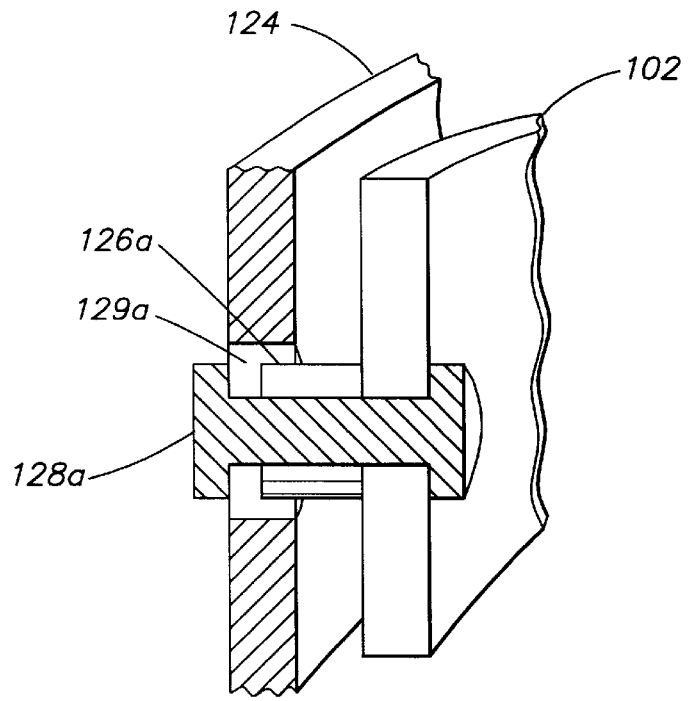
FIG. 1E is a close-up view of a cup and pin that couple the coil and shield of FIG. 1B.

FIG. 1B is a top plan view of the coil 102 coupled to the shield 124 via the cups 126*a–e* and the pins 128*a–e*. The cups 126*a–e* and the pins 128*a–e* are electrically isolated from the shield 124 via the insulating regions 129*a–e*. The first RF power supply 104 is coupled to the coil 102 via a first feedthrough 105*a* and via a second feedthrough 105*b* as shown. A close-up of the connection between the feedthroughs 105*a*, 105*b* and the coil 102 is shown in FIG. 1C, and a close-up of the connection between the coil 102 and the shield 124 (via the cup 126*a*, the pin 128*a* and the insulating region 129*a*) is shown in FIG. 1E.

Figure 1F:
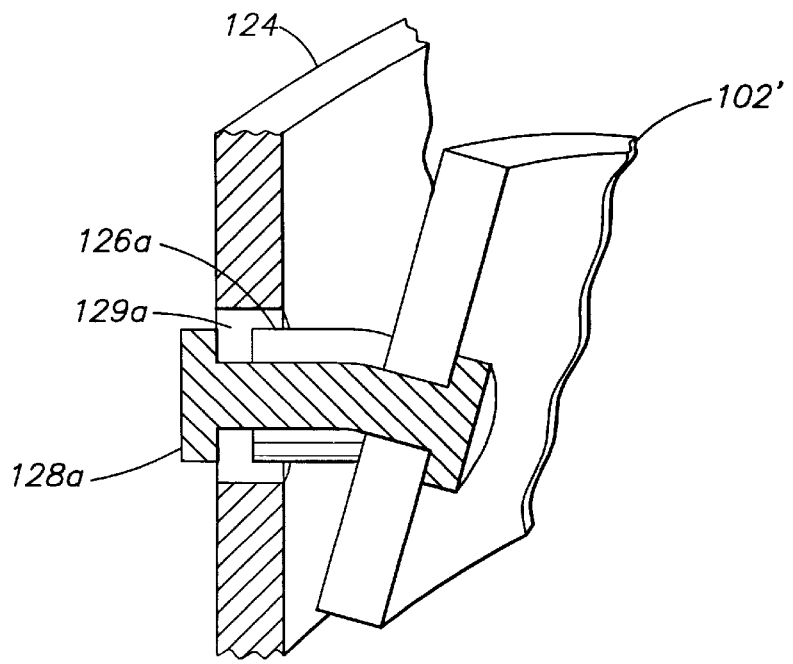
FIG. 1F is a close-up view of a conventional coil short circuited to the shield of FIG. 1B.

If a conventional coil 102' is employed within the deposition chamber 100, following repeated depositions within the chamber 100, the coil 102' may disconnect from either the first feedthrough 105*a* or the second feedthrough 105*b* as shown in FIG. 1D. The coil 102' also may be short circuited through contact with the shield 124 as shown in FIG. 1F. Electrical disconnection of the coil 102' from either feedthrough 105*a*, 105*b* occurs due to thermal creep induced movement of the coil away from the feedthroughs 105*a*, 105*b* that is driven by the thermal cycling of the coil 102' that accompanies repeated depositions. Thermal creep induced movement of the coil 102' toward the shield 124 similarly causes short circuiting of the coil 102'. However, by reducing the thermal creep rate of the inventive coil 102 (as described below) thermal creep induced movement of the coil 102 away from the feedthroughs 105*a*, 105*b* and toward the shield 124 is significantly reduced so that electrical disconnection and short circuiting of the coil 102 do not occur and the coil 102 primarily maintains the position shown in FIG. 1C and FIG. 1E.

As previously described, aluminum targets/coils typically are formed from a 0.5% copper/99.5% aluminum alloy that has sufficient mechanical strength and a small enough grain size to prevent significant mechanically induced splat formation. Likewise, the thermal creep rate of alloyed aluminum coils typically is low enough to prevent electrical disconnection of an aluminum coil from the feedthroughs 105 or electrical shorting of the aluminum coil due to contact with the shield 124 following repeated HDP depositions. Accordingly, the main concern with aluminum coils is defect generation; and the preferred aluminum coil material is the same as the preferred aluminum target material described in parent application, U.S. Ser. No. 08/979,192, filed Nov. 26, 1997. Specifically, for aluminum deposition within the HDP deposition chamber 100, the coil 102 preferably has one or more of the characteristics listed in TABLE 1, and most preferably in TABLE 2. All other aluminum material characteristics described in parent application, U.S. Ser. No. 08/979,192, filed Nov. 26, 1997, may be employed for the coil 102, and the coil 102 may be manufactured as described therein or by any other known techniques.

TABLE 1

| PROPERTY | PREFERRED RANGE |
|---|---|
| Dielectric Inclusion Content, where such inclusions have widths ot 0.3 micron or more | less than about 5000 inclusions per gram of coil material |
| Hydrogen content | less than about 0.5 ppm |
| Carbon content | less than about 10 ppm |
| Oxygen content | less than about 10 ppm |
| Nitrogen content | less than about 10 ppm |
| Metal grain size | less than about 100 micron |
| (200) textured material | greater than 50% |
| (111) textured material | less than about 3% |
| Hardness | greater than about 50 (Rockwell scale) |
| Surface roughness | less than about 20 microinches |
| Alloy strengthening addend | greater than about 0.5% Cu by weight |
| Alloy precipitate size | about 5 microns or less |
| Other impurities | less than about 10 ppm |

TABLE 2

| PROPERTY | PREFERRED RANGE |
|---|---|
| Dielectric Inclusion Content, where such inclusions have widths of 0.1 micron or more | less than about 5000 inclusions per gram of coil material |
| Hydrogen content | less than about 0.075 ppm |
| Carbon content | less than about 5 ppm |
| Oxygen content | less than about 10 ppm |
| Nitrogen content | less than about 7 ppm |
| Metal grain size | between about 75 micron and 90 micron |
| (200) textured material | greater than 75% |
| (111) textured material | less than about 1% |
| Hardness | greater than about 50 (Rockwell scale) |
| Surface roughness | less than about 16 microinches |
| Alloy strengthening addend | about 0.5% Cu by weight |
| Alloy precipitate size | less than about 4 microns |
| Other impurities | less than about 5 ppm |

Unlike aluminum coils, copper coils are much more susceptible to electrical disconnection and/or short circuiting because copper is naturally a soft metal and thus has a larger thermal creep rate. Accordingly, as the purity level of a copper coil increases, the likelihood of thermal creep induced electrical disconnection and/or short circuiting increases.

Figure 2:
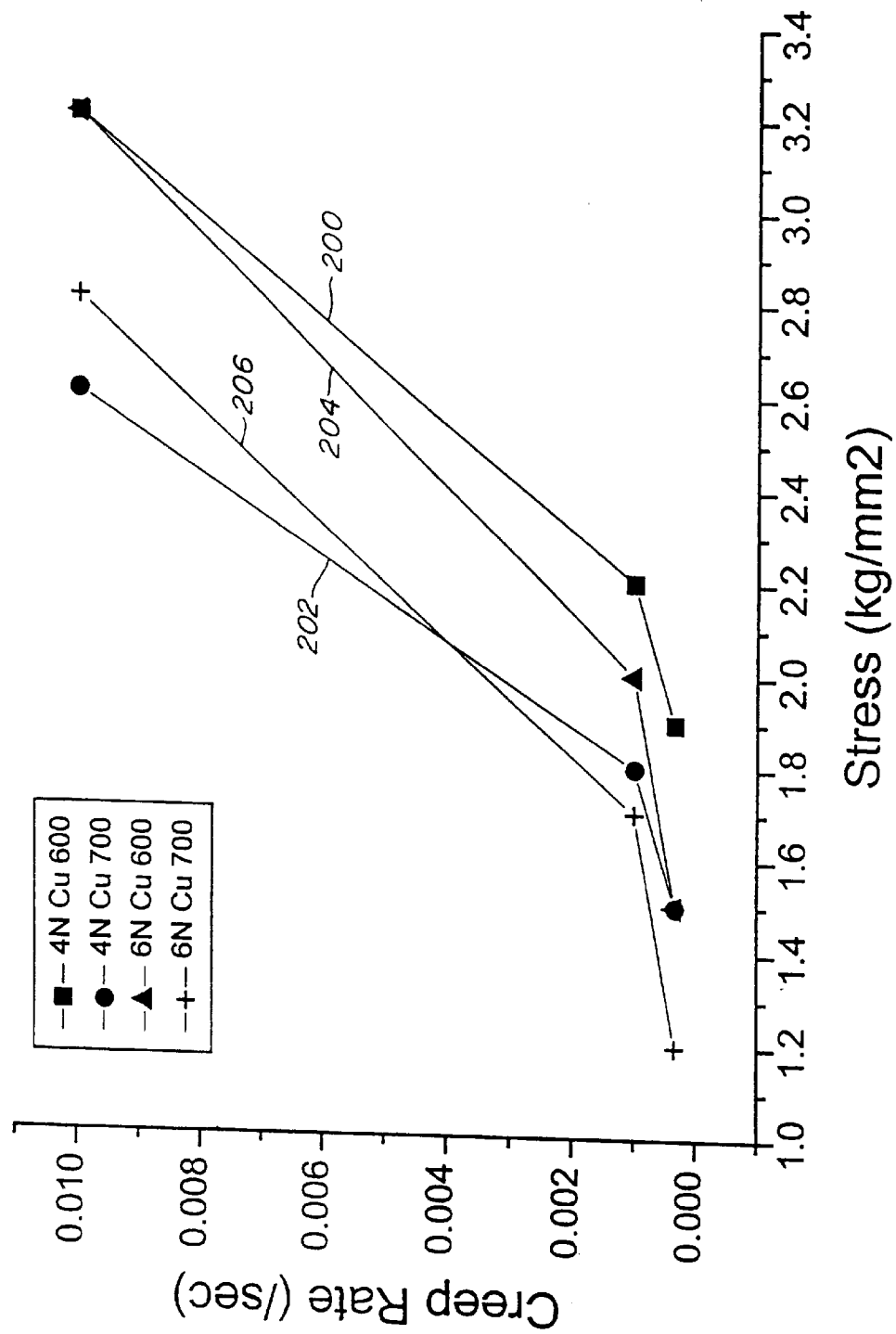
FIG. 2 is a graph of thermal creep rate versus applied stress for a 99.99% pure copper coil at 600° C. and at 700° C., and for a 99.9999% pure copper coil at 600° C. and 700° C.

FIG. 2 is a graph of thermal creep rate versus applied stress for a 99.99% pure copper coil at 600° C. (first curve 200) and at 700° C. (second curve 202), and for a 99.9999% pure copper coil at 600° C. (third curve 204) and at 700° C. (fourth curve 206). With reference to FIG. 2, for a given applied stress level, the thermal creep rate generally increases with copper coil purity (e.g., thermal creep rate may be reduced by reducing copper coil purity) because the mechanical strength of the coil decreases as copper purity increases.

Accordingly, to reduce splat formation and thermal creep during copper film deposition, a copper coil is provided having both increased mechanical strength (e.g., hardness) and decreased inclusion content. Specifically, a copper coil is provided having a hardness value greater than about 45 Rockwell as the present inventors have discovered that copper coils having hardnesses greater than about 45 Rockwell produce far fewer splats than softer copper coils and do not electrically disconnect or short circuit following repeated depositions.

To control hardness, the grain size of a copper coil preferably is decreased. Grain size is decreased (and hardness increased) preferably by limiting copper coil material purity to a level of less than 99.9999%, preferably within a range between 99.995% to 99.9999% copper. This purity range is significantly less than the purity level of many commercially available copper coils, and is in stark contrast to the industry trend of using higher and higher purity copper coils. Copper coils having purity levels in the range between 99.995% and 99.9999% can have hardnesses greater than 45 Rockwell if properly manufactured (e.g., employing the manufacturing methods described in parent application U.S. Ser. No. 09/272,974, filed Mar. 18, 1999).

TABLES 3 and 4 contain preferred and most preferred, respectively, copper coil material parameter ranges for reducing splat formation and thermal creep during plasma processing, although a purity level of less than 99.9999% copper is specifically contemplated by the inventors.

TABLE 3

| | |
|---|---|
| Purity level | 99.995% to 99.9999% |
| Antimony content | Less than about 0.03 ppm |
| Arsenic content | Less than about 0.03 ppm |
| Bismuth content | Less than about 0.03 ppm |
| Carbon content | Less than about 5.0 ppm |
| Hydrogen content | Less than about 1.0 ppm |
| Oxygen content | Less than about 5.0 ppm |
| Nitrogen content | Less than about 1.0 ppm |
| Sulfur content | Less than about 1.0 ppm |
| Metal grain size | Less than about 50 micron |
| (200) textured material | Greater than 50% |
| (111) textured material | Less than about 3% |
| Hardness | Greater than 45 (Rockwell scale) |
| Surface roughness | Less than about 20 micro-inches |
| Other Impurities | Less than about 10 ppm |

TABLE 4

| | |
|---|---|
| Purity level | 99.995% to 99.9999% |
| Antimony content | Less than about 0.03 ppm |
| Arsenic content | Less than about 0.03 ppm |
| Bismuth content | Less than about 0.03 ppm |
| Carbon content | Less than about 1.0 ppm |
| Hydrogen content | Less than about 1.0 ppm |
| Oxygen content | Less than about 1.0 ppm |
| Nitrogen content | Less than about 1.0 ppm |
| Sulfur content | Less than about 0.05 ppm |
| Metal grain size | Less than about 25 micron |
| (200) textured material | Greater than 50% |
| (111) textured material | Less than about 3% |
| Hardness | Greater than 45 (Rockwell scale) |
| Surface roughness | Less than about 5.0 micro-inches |
| Other Impurities | Less than about 10 ppm |

A copper coil hardness greater than 45 Rockwell provides adequate localized material strength and immunity against mechanical fracturing to reduce splat formation during copper film deposition and a small enough thermal creep rate to prevent electrical disconnection and short circuiting of the copper coil following repeated depositions. This hardness range preferably is achieved by limiting grain size to less than about 50 microns (TABLE 3) and preferably to less than about 25 microns (TABLE 4). This grain size range is achieved via selection of the purity range of 99.995% to 99.9999%.

Minimizing oxygen incorporation with the copper coil material is very important for reducing metal oxide dielectric inclusions such as CuO. Further, limiting nitrogen and carbon content, while less important, reduces metal nitride and metal carbide inclusions, respectively.

Impurities that adversely affect mechanical properties of a copper coil include antimony, arsenic, bismuth, hydrogen and sulfur. Antimony, arsenic, bismuth and sulfur reduce copper coil hardness through interactions at copper grain boundaries. Sulfur, for instance, readily forms CuS at copper grain boundaries which renders a copper coil brittle and susceptible to arc-induced mechanical failure. Accordingly, reducing antimony, arsenic, bismuth and sulfur content increases copper coil mechanical strength, and can reduce splat formation.

Hydrogen is highly mobile in copper and embrittles copper by combining with copper oxide to form water ($H_2O$). Additionally, trapped hydrogen forms voids during casting of the copper coil. Reducing hydrogen content, therefore, reduces splat formation by reducing arc-induced mechanical failure and field-enhanced emission due to gas trapping.

Other common impurities within copper coil material include metallic impurities such as aluminum, iron, magnesium, silver and zinc. These metallic impurities usually are the highest concentration impurities and thus are the primary factors controlling grain size and hardness of the copper coil. Therefore, one or more of the metallic impurities should be present in the range of approximately 100 to 5000 ppm to maintain the purity level of the copper coil material within the range of 99.995% to 99.9999%.

Metal working techniques such as forging, rolling and deforming alter the texture and hardness of the copper coil. As known in the art, post-work metal texturing of at least 50% (200) texture and less than 3% (111) texture enhances uniformity of physical vapor deposition and is preferred.

Finally, providing a copper coil with smooth surfaces (e.g., less than 20 micro inches, more preferably less than 5 micro inches) reduces the number of sharp protrusions on the coil's surfaces so as to reduce field-enhanced emission induced splat formation during copper film deposition. The smoothed surfaces should be ultrasonically cleaned prior to use to reduce arc-inducing surface contaminants that can otherwise permanently roughen the smoothed surface (e.g., via arcing during burn-in).

With reference to FIG. 1, deposition of a copper film having a substantially reduced in-film defect (e.g., splat) density is performed by:

1. providing a copper coil 102 and a copper target 106 having one or more properties in accordance with TABLE 3 and/or TABLE 4;
2. placing the substrate 138 on the pedestal 108;
3. biasing the target 106 relative to the shield 124 and pedestal 108;
4. applying RF power to the coil 102;
5. introducing argon into the shielded region of the chamber 100 so as to produce a plasma therein; and
6. maintaining the plasma until the desired thickness for the copper film is formed on the substrate 138.

Preferably about 1–3 kW of power is applied to the target 106 and 1–3 kW of power is applied to the coil 102 (most preferably 2 kW) during copper deposition. A similar process may be performed for the deposition of an aluminum film having a substantially reduced in-film defect density, if an aluminum coil and an aluminum target having one or more properties in accordance with TABLE 1 and/or TABLE 2 are employed.

Primarily because the copper coil 102 and the copper target 106 are harder than conventional copper coils and targets and have fewer dielectric inclusions, copper films deposited using the copper coil 102 and the copper target 106 have significantly fewer in-film defects than copper films deposited via conventional copper coils and targets. Further, the cost of depositing copper films is reduced as the copper coil 102 and the copper target 106 are less expensive to manufacture than the ultra-high purity copper coils and targets typically employed.

The foregoing description discloses only the preferred embodiments of the invention, modifications of the above disclosed apparatus and method which fall within the scope of the invention will be readily apparent to those of ordinary skill in the art. For instance, limiting the purity range of copper coil material is the preferred method for increasing copper coil strength and reducing thermal creep rate. However, it may be possible to alloy a copper coil having a purity level higher than 99.9999% while still maintaining adequate copper coil hardness and small grain size. Further, various manufacturing methods may be employed to achieve one or more of the desired ranges set forth in TABLES 1–4.

Accordingly, while the present invention has been disclosed in connection with the preferred embodiments thereof, it should be understood that other embodiments may fall within the spirit and scope of the invention as defined by the following claims.

The invention claimed is:

1. A high density plasma chamber comprising:
   a coil disposed between a sputtering target and a substrate pedestal;
   a feedthrough coupled to the coil and adapted to supply electrical power thereto; and
   a support supporting the coil;
   wherein the coil has one or more material characteristics selected to reduce in-film defect densities of a film formed during sputter deposition within the chamber and is characterized by a material strength sufficient to prevent at least one of electrical disconnection of the coil from the feedthrough and short circuiting of the coil due to contact with the support following repeated depositions within the chamber;
   wherein the coil comprises a copper coil characterized by a hardness greater than 45 Rockwell.

2. A high density plasma chamber comprising:
   a coil disposed between a sputtering target and a substrate pedestal;
   a feedthrough coupled to the coil and adapted to supply electrical power thereto; and
   a support supporting the coil;
   wherein the coil has one or more material characteristics selected to reduce in-film defect densities of a film formed during sputter deposition within the chamber and is characterized by a material strength sufficient to prevent at least one of electrical disconnection of the coil from the feedthrough and short circuiting of the coil due to contact with the support following repeated depositions within the chamber;
   wherein the coil comprises an aluminum coil characterized by a homogeneous content of about 10,000 or less conductivity anomalies per gram wherein each conductivity anomaly within the about 10,000 or less conductivity anomalies is a region having a width of at least 1 micron and wherein each conductivity anomaly defines an insulative or high resistivity region, high resistivity being at least 100 times greater than a corresponding electrical resistivity of an anomaly-free representative portion of the aluminum coil.

3. A method of producing a copper film having a reduced in-film defect level comprising:
   providing a substrate;
   providing a copper target;
   providing a copper coil between the substrate and the copper target, the copper coil characterized by a hardness greater than 45 Rockwell; and
   sputtering the copper target so as to deposit a copper film on the substrate.

4. The method of claim 3 wherein providing a copper coil further comprises providing a copper coil characterized by:
   a grain size of less than 50 microns; and
   a surface roughness of less than 20 micro inches.

5. The method of claim 3 wherein providing a copper coil further comprises providing a copper coil characterized by:
   a grain size of less than 25 microns; and
   a surface roughness of less than 5 micro inches.

6. The method of claim 3 wherein providing a copper coil further comprises providing a copper coil characterized by a purity level between 99.995% and 99.9999% and at least one of:
   an antimony, an arsenic and a bismuth content each of less than 0.03 ppm;
   a hydrogen content of less than 1.0 ppm;
   an oxygen content of less than 5.0 ppm; and
   a sulfur content of less than 1.0 ppm.

7. A method of producing a copper film having a reduced in-film defect level comprising:
   providing a substrate;
   providing a copper target;
   providing a copper coil between the substrate and the copper target, the copper coil characterized by:
   a grain size of less than 50 microns;
   a surface roughness of less than 20 micro inches; and
   a purity level between 99.995% and 99.9999% and at least one of:
      an antimony, an arsenic and a bismuth content each of less than 0.03 ppm;
      a hydrogen content of less than 1.0 ppm;
      an oxygen content of less than 5.0 ppm; and
      a sulfur content of less than 1.0 ppm; and
   sputtering the copper target so as to deposit a copper film on the substrate.

8. The method of claim 7 wherein providing the copper coil further comprises providing a copper coil characterized by:
   a grain size of less than 25 microns;
   a surface roughness of less than 5 micro inches; and
   a purity level between 99.995% and 99.9999% and at least one of:
      an oxygen content of less than 1.0 ppm; and
      sulfur content of less than 0.05 ppm.

9. A method of producing a copper film having a reduced in-film defect level comprising:
   providing a substrate;
   providing a copper target;
   providing a copper coil between the substrate and the copper target, the copper coil characterized by:
   a grain size of less than 50 microns;
   a surface roughness of less than 20 micro inches; and
   a purity level less than 99.9999% and at least one of:
      an antimony, an arsenic and a bismuth content each of less than 0.03 ppm;
      a hydrogen content of less than 1.0 ppm;
      an oxygen content of less than 5.0 ppm; and
      a sulfur content of less than 1.0 ppm; and
   sputtering the copper target so as to deposit a copper film on the substrate.

* * * * *